(12) United States Patent
Woo (10) Patent No.: US 8,049,278 B2
(45) Date of Patent: Nov. 1, 2011

(54) ESD PROTECTION FOR HIGH VOLTAGE APPLICATIONS

(75) Inventor: Agnes Neves Woo, Encino, CA (US)

(73) Assignee: Broadcom Corporation, Irvine, CA (US)

( * ) Notice: Subject to any disclaimer, the term of this patent is extended or adjusted under 35 U.S.C. 154(b) by 3 days.

(21) Appl. No.: 12/285,679

(22) Filed: Oct. 10, 2008

(65) Prior Publication Data

US 2009/0045464 A1 Feb. 19, 2009

Related U.S. Application Data

(63) Continuation of application No. 11/198,277, filed on Aug. 8, 2005, now Pat. No. 7,439,592.

(60) Provisional application No. 60/635,180, filed on Dec. 13, 2004.

(51) Int. Cl.
*H01L 23/62* (2006.01)
*H01L 21/8238* (2006.01)

(52) U.S. Cl. ........ 257/362; 257/655; 257/133; 257/119; 438/135; 438/208; 438/223

(58) Field of Classification Search ................... 257/356, 257/362; 438/208, 223, 135
See application file for complete search history.

(56) References Cited

U.S. PATENT DOCUMENTS

| | | | | |
|---|---|---|---|---|
| 3,469,155 A | * | 9/1969 | Beek | ............................ 257/362 |
| 3,787,717 A | | 1/1974 | Fischer et al. | |
| 4,044,373 A | * | 8/1977 | Nomiya et al. | ............... 257/356 |
| 4,151,425 A | | 4/1979 | Cappa | |
| 4,385,337 A | | 5/1983 | Asano et al. | |
| 4,417,162 A | | 11/1983 | Keller et al. | |
| 4,423,431 A | | 12/1983 | Sasaki | |
| 4,593,349 A | | 6/1986 | Chase et al. | |
| 4,674,031 A | | 6/1987 | Siska, Jr. | |
| 4,763,184 A | | 8/1988 | Krieger et al. | |

(Continued)

FOREIGN PATENT DOCUMENTS

EP 0 393 717 A2 10/1990

(Continued)

OTHER PUBLICATIONS

Kwon, K. et al., "A Novel ESD Protection Technique for Submicron CMOS/BiCMOS Technologies," EOS/ESD Symposium 95-21, pp. 1.3.1-1.3.6 (1995), Dec. 1995.

(Continued)

*Primary Examiner* — Thanh V Pham
*Assistant Examiner* — Caleb Henry
(74) *Attorney, Agent, or Firm* — Sterne, Kessler, Goldstein & Fox P.L.L.C.

(57) ABSTRACT

An ESD device includes a low doped well connected to a first contact and a diffusion area connected to a second contact. A substrate between the low doped well and the diffusion area has a dopant polarity that is opposite a dopant polarity of the low doped well and the diffusion area. A distance between the low doped well and the diffusion area determines a triggering voltage of the ESD device. A depletion region is formed between the low doped well and the substrate when a reverse bias voltage is applied to the ESD device. A current discharging path is formed between the first contact and the second contact when the depletion region comes in to contact with the diffusion area. The substrate is biased by a connection to the second contact. Alternatively, an additional diffusion area with the same dopant polarity, connected to a third contact, biases the substrate.

22 Claims, 10 Drawing Sheets

U.S. PATENT DOCUMENTS

| | | | |
|---|---|---|---|
| 4,789,976 A | 12/1988 | Fujishima | |
| 4,818,903 A | 4/1989 | Kawano | |
| 4,903,329 A | 2/1990 | Marik et al. | |
| 5,031,233 A | 7/1991 | Ragan | |
| 5,079,612 A | 1/1992 | Takamoto et al. | |
| 5,162,888 A | 11/1992 | Co et al. | |
| 5,180,965 A | 1/1993 | Nose | |
| 5,237,395 A | 8/1993 | Lee | |
| 5,239,440 A | 8/1993 | Merrill | |
| 5,290,724 A | 3/1994 | Leach | |
| 5,329,143 A | 7/1994 | Chan et al. | |
| 5,428,829 A | 6/1995 | Osburn et al. | |
| 5,430,595 A | 7/1995 | Wagner et al. | |
| 5,446,302 A | 8/1995 | Beigel et al. | |
| 5,530,612 A | 6/1996 | Maloney | |
| 5,560,022 A | 9/1996 | Dunstan et al. | |
| 5,574,618 A | 11/1996 | Croft | |
| 5,610,790 A | 3/1997 | Staab et al. | |
| 5,616,943 A | 4/1997 | Nguyen et al. | |
| 5,633,825 A | 5/1997 | Sakuta et al. | |
| 5,654,862 A | 8/1997 | Worley et al. | |
| 5,739,587 A | 4/1998 | Sato | |
| 5,751,507 A | 5/1998 | Watt et al. | |
| 5,752,046 A | 5/1998 | Oprescu et al. | |
| 5,825,600 A | 10/1998 | Watt | |
| 5,828,589 A | 10/1998 | Degenhardt | |
| 5,872,379 A | 2/1999 | Lee | |
| 5,903,419 A | 5/1999 | Smith | |
| 5,917,220 A | 6/1999 | Waggoner | |
| 5,917,336 A | 6/1999 | Smith et al. | |
| 6,011,420 A | 1/2000 | Watt et al. | |
| 6,014,039 A | 1/2000 | Kothandaraman et al. | |
| 6,034,400 A | 3/2000 | Waggoner et al. | |
| 6,046,897 A | 4/2000 | Smith et al. | |
| 6,078,068 A | 6/2000 | Tamura | |
| 6,144,542 A | 11/2000 | Ker et al. | |
| 6,237,103 B1 | 5/2001 | Lam et al. | |
| 6,246,262 B1 | 6/2001 | Morgan | |
| 6,317,305 B1 | 11/2001 | Dedic | |
| 6,345,362 B1 | 2/2002 | Bertin et al. | |
| 6,437,955 B1 | 8/2002 | Duffy et al. | |
| 6,509,779 B2 | 1/2003 | Yue et al. | |
| 6,587,321 B2 | 7/2003 | Woo | |
| 6,593,794 B2 | 7/2003 | Yue et al. | |
| 6,597,227 B1 | 7/2003 | Yue et al. | |
| 6,639,771 B2 | 10/2003 | Li | |
| 6,671,816 B1 | 12/2003 | Woo | |
| 6,862,161 B2 | 3/2005 | Woo | |
| 6,885,534 B2 | 4/2005 | Ker et al. | |
| 6,963,110 B2 | 11/2005 | Woo et al. | |
| 7,013,402 B2 | 3/2006 | Woo | |
| 7,154,150 B2 | 12/2006 | Hu et al. | |
| 7,439,592 B2 | 10/2008 | Woo | |
| 2002/0185688 A1* | 12/2002 | Wu et al. | 257/360 |
| 2006/0152870 A1 | 7/2006 | Chen et al. | |

FOREIGN PATENT DOCUMENTS

| | | |
|---|---|---|
| EP | 0 431 887 A2 | 6/1991 |
| EP | 0 505 158 A2 | 9/1992 |
| EP | 0 535 536 A1 | 4/1993 |
| EP | 0 663 727 A1 | 7/1995 |
| GB | 2 319 893 A | 6/1998 |
| WO | WO 97/09786 A1 | 3/1997 |
| WO | WO 00/21134 A1 | 4/2000 |

OTHER PUBLICATIONS

Galal, S. and Razavi, B., "Broadband ESD Protection Circuits in CMOS Technology," IEEE Journal of Solid-State Circuits, vol. 38, No. 12, pp. 2334-2340 (Dec. 2003).

Ker, M. and Lin, K., "Design on ESD Protection Scheme for IC With Power-Down-Mode Operation," IEEE Journal of Solid-State Circuits, vol. 39, No. 8, pp. 1378-1382 (Aug. 2004).

Dallas Semiconductor, Data Sheet for DS1802, Dual Audio Taper Potentiometer With Pushbutton Control, pp. 1-17.

Dallas Semiconductor, Data Sheet for DS1801, Dual Audio Taper Potentiometer, pp. 1-10.

Narita et al., "A Novel On-Chip Electrostatic Discharge (ESD) Protection With Common Discharge Line for High-Speed CMOS LSI's", IEEE Transactions on Electron Devices, vol. 44, No. 7, pp. 1124-1130, Jul. 7, 1997.

Ker et al., "ESD Protection to Overcome Internal Gate-Oxide Damage on Digital-Analog Interface of Mixed-Mode CMOS IC's", Proc. 7th Europ. Symp. Reliability of Electron Devices, Failure Physics and Analysis., vol. 36, No. 11/12, pp. 1727-1730, 1996.

Narita et al., "A Novel On-Chip Electrostatic Discharge (ESD) Protection for Beyond 500 MHz DRAM", IEDM Tech. Dig., pp. 539-542, 1995.

Ker et al., "ESD Buses for Whole-Chip ESD Protection", Proc. of IEEE International Symposium on Circuits and Systems, Orlando, Florida, pp. 545-548, May 30-Jun. 2, 1999.

Ker et al., "Whole-Chip ESD Protection Design for Submicron CMOS VLSI", IEEE International Symposium on Circuits and Systems, Jun. 9-12, 1997, Hong Kong, pp. 1920-1923.

Ker et al., "Whole-Chip ESD Protection Scheme for CMOS Mixed-Mode IC's in Deep-Submicron CMOS Technology", Proc. of IEEE Custom Integrated Circuits Conference (CICC), Santa Clara, CA, May 5-8, 1997, pp. 31-34.

Ker et al., "Whole-Chip ESD Protection for CMOS VLSI/ULSI With Multiple Power Pins", 94 IRW Final Report, pp. 124-128, 1994.

Ker et al., "Whole-Chip ESD Protection Strategy for CMOS IC's With Multiple Mixed-Voltage Power Pins", Proc. of 1999 International Symposium on VLSI Technology, System, and Application, Taipei, Taiwan, Jun. 8-10, 1999, pp. 298-301.

Ker, Ming-Dou, "Whole-Chip ESD Protection Design With Efficient VDD-to-VSS ESD Clamp Circuits for Submicron CMOS VLSI", IEEE Transaction on Electron Devices, vol. 46, No. 1, pp. 173-183, Jan. 1999.

Photograph of Dallas Semiconductor DS1801, Dual Audio Taper Potentiometer (1 page).

Photograph of Dallas Semiconductor DS1802, Dual Audio Taper Potentiometer With Pushbutton Control (4 pages).

Ming-Dou Ker, "Tutorial to Design of ESD/Latchup Protection in Submicron CMPS IC's", VLSI Design Division, Computer & Communication Research Laboratories, Taiwan, Jul. 1997(111 pages).

Thomas Polgreen, "Tutorial H, Selecting and Implementing the Appropriate ESD Protection Strategy", Electrostatic Discharge Association, Rome, NY, Oct. 5, 1998 (47 pages).

Thomas Polgreen, Tutorial I, Selecting and Implementing the Appropriate ESD Protection Strategy, Electrostatic Discharge Association, Rome, NY, Sep. 22, 1997 (40 pages).

Poole et al., "A CMOS Subscriber Line Audio Processing Circuit Including Adaptive Balance," IEEE Proceedings of the International Symposium on Circuits and Systems, US, New York, vol. Conf. 21, 1988, pp. 1931-1934.

N. Weste et al., Principles of CMOS VLSI Design, Addison-Wesley Publishing Co., 1985, pp. 86-87.

Duvvury et al., "ESD Protection: Design and Layout Issues for VLSI Circuits," IEEE Transactions on Industry Application, vol. 25 No. 1, Jan./Feb. 1989, pp. 41-47.

Keller, J. K., "Protection of MOS Integrated Circuits from Destruction by Electrostatic Discharge," IIT Research Institute, 1981, pp. 73-80.

Hulett, T.V., "On Chip Protection of High Density NMOS Devices," pp. 90-96.

Protective Device, at http://www.delphion.com/tdbs/tdb?&order=85A+61057, IBM Technical Disclosure Bulletin, Apr. 1985, pp. 6814-6815.

* cited by examiner

ESD PROTECTION FOR HIGH VOLTAGE APPLICATIONS

CROSS REFERENCE TO RELATED APPLICATIONS

This application is a continuation of allowed U.S. patent application Ser. No. 11/198,277, filed on Aug. 8, 2005, now U.S. Pat. No. 7,439,592 titled "ESD Protection for High Voltage Applications", which claims the benefit of U.S. Provisional Patent Application No. 60/635,180, filed Dec. 13, 2004, both of which are incorporated herein by reference in their entirety.

BACKGROUND OF THE INVENTION

1. Field of the Invention

The present invention generally relates to electrostatic discharge (ESD) protection. More specifically, the present invention provides ESD protection for high voltage integrated circuits (ICs).

2. Background Art

It is often difficult to provide ESD protection on a high voltage IC that requires devices with high voltage tolerances. High voltage devices must have breakdown voltages that are higher than the operating voltages of the high voltage IC. The ESD protection must provide an ESD trigger voltage that is higher than the operating voltages of the high voltage IC and yet lower than the breakdown voltages of the high voltage devices. The operating voltages of the high voltage IC often approach the breakdown voltages of the high voltage devices, thereby making an acceptable range of the ESD trigger voltage narrow and difficult to achieve.

Conventional IC devices, such as Metal-Oxide Semiconductor (MOS) Field Effect Transistors (MOSFETs) and Bipolar Junction Transistors (BJTs), fail to provide voltage tolerances required by high voltage ICs. High voltage devices are therefore typically constructed with alternative technologies. These alternative high voltage devices may include Lateral Diffused MOS (LDMOS) transistors, Lateral Insulated Gate Bipolar Transistors (LIGBTs) and other devices. Since these high voltage devices are designed to withstand high voltages, they are not optimized to work as ESD discharge devices. Conventional devices cannot be used to provide ESD protection because the operating voltages usually exceed the breakdown voltages of the conventional devices.

Silicon Controlled Rectifier (SCR) structures are commonly used to provide ESD protection for high voltage ICs. A drawback of the SCR device is its relatively slow turn-on time. Another drawback of the SCR device is its triggering mechanism. The triggering of the SCR device is initiated by a substrate current generated by a pn-junction breakdown. This pn-junction, however, is also designed to have a high breakdown voltage for use in high voltage applications. Therefore, it is difficult to design the SCR device with a pn-junction that can satisfy these conflicting design goals. The effectiveness of the SCR structure is further compromised when a low resistively substrate is used, a common practice for high voltage ICs.

Processing steps used to fabricate high voltage ICs also render other commonly used ESD protection techniques ineffective. For example, snapback MOS devices provide poor ESD protection because their desired parasitic bipolar characteristic is purposely subdued in many fabrication processes. MOS-based ESD protection devices suffer from the characteristic high threshold voltage and channel resistance of high voltage MOSs, which results in excessive layout overhead. Diode-based ESD protection devices suffer from the high parasitic series resistance inherent in high voltage processing techniques, which also results in excessive layout overhead. Another obstacle in the design of high voltage ESD protection includes building resistors and capacitors in the ESD protection circuits that can tolerate high voltages.

BRIEF SUMMARY OF THE INVENTION

Accordingly, the invention provides ESD protection for use in high voltage ICs by substantially obviating one or more of the disadvantages of the related art.

In one aspect of the invention, there is provided an ESD device including a low doped well connected to a first contact and a diffusion area connected to a second contact. A substrate between the low doped well and the diffusion area is connected to the second contact. The substrate has a dopant polarity that is opposite a dopant polarity of the low doped well and the diffusion area. A distance between the low doped well and the diffusion area determines a triggering voltage of the ESD device. A depletion region is formed between the low doped well and the substrate when a reverse bias voltage is applied to the ESD device. A current discharging path is formed between the first contact and the second contact when the reverse bias voltage causes the depletion region to come into contact with the diffusion region.

In another aspect of the invention, there is provided an ESD device including a low doped well connected to a first contact, a first diffusion area connected to a second contact and a second diffusion area connected to a third contact. The ESD device includes a substrate between the low doped well and the first diffusion area. The substrate and the second diffusion area have dopant polarities that are opposite dopant polarities of the low doped well and the first diffusion area. A distance between the low doped well and the first diffusion area determines a triggering voltage of the ESD device. A depletion region is formed between the low doped well and the substrate when a reverse bias voltage is applied to the ESD device. A current discharging path is formed between the first contact and the second contact when the reverse bias voltage causes the depletion region to come into contact with the diffusion region. A pn-junction formed between the low doped well and the substrate is forward biased when a forward bias voltage is applied to the ESD device. The pn-junction is well biased by the forward bias voltage and provides a forward bias ESD discharge path.

In another aspect of the invention, there is a provided a method of forming an ESD device including a substrate, a low doped well positioned within the substrate and connected to a first contact and a diffusion area positioned within the substrate and connected to a second contact. The substrate is connected to the second contact and has a dopant polarity that is opposite a dopant polarity of the low doped well and a dopant polarity of the diffusion area. A distance between the low doped well and the diffusion area determines a triggering voltage of the ESD device.

In another aspect of the invention, there is a provided a method of forming an ESD device including a substrate and a low doped well positioned within the substrate and connected to a first contact. The ESD device also includes a first diffusion area positioned within the substrate and connected to a second contact and a second diffusion area positioned within the substrate and connected to a third contact. The substrate and the second diffusion area have dopant polarities that are opposite dopant polarities of the low doped well and the first diffusion area. A distance between the low doped well and the first diffusion area determines a triggering voltage of the ESD device.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS/FIGURES

The accompanying drawings illustrate the present invention and, together with the description, further serve to explain the principles of the invention and to enable one skilled in the pertinent art to make and use the invention.

DETAILED DESCRIPTION OF THE INVENTION

Figure 1A:
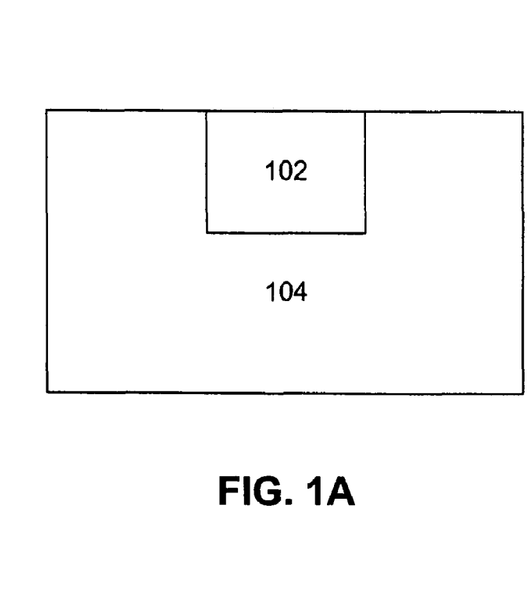
FIG. 1A illustrates a doped semiconductor device with a conventional doped well having a low breakdown voltage.
Figure 1B:
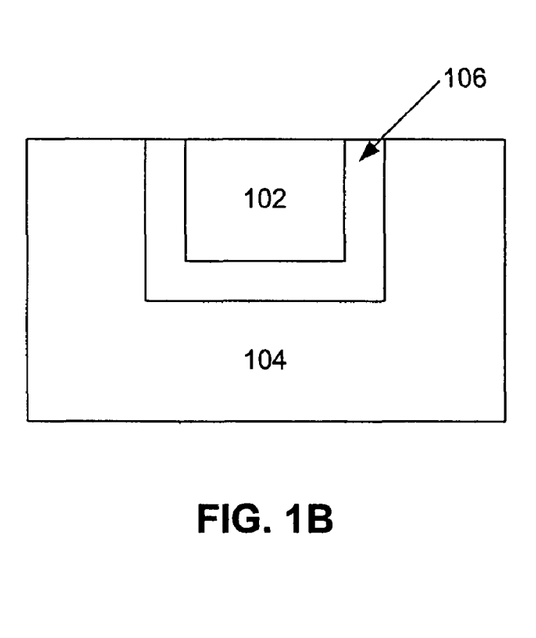
FIG. 1B illustrates the behavior of the doped semiconductor device depicted in FIG. 1A when a reverse bias voltage is applied to the doped semiconductor device.

FIG. 1A and FIG. 1B illustrate a doped semiconductor device 100 having a low breakdown voltage. As shown in FIG. 1A, the doped semiconductor device 100 includes a conventional doped well 102 and a doped substrate 104. The conventional doped well 102 has a relatively high concentration of dopant and has a shallow junction depth, relative to the depth of the doped substrate 104. A conventional doped well typically has a concentration level on the order of $10^{17}/cm^3$. The doped substrate 104 also has a relatively high concentration of dopant. The polarity of the dopant added to the doped substrate 104, however, is opposite the polarity of the dopant added to the conventional doped well 102. For example, if the conventional doped well 102 is a p-type material, then the doped substrate 104 is an n-type material. Alternatively, if the conventional doped well 102 is an n-type material, then the doped substrate 104 is a p-type material. A pn-junction is therefore formed by the intimate contact of the conventional doped well 102 with the doped substrate 104 under either doping scenario.

FIG. 1A shows the doped semiconductor device 100 without a bias voltage applied to the conventional doped well 102 and the doped substrate 104. FIG. 1B illustrates the behavior of the doped semiconductor device 100 when a reverse bias voltage is applied to the conventional doped well 102 and the doped substrate 104. A reverse bias voltage is applied to the doped semiconductor device 100 when the polarities of the voltages applied to the conventional doped well 102 and the doped substrate 104 are opposite the respective polarities of the dopants within the conventional doped well 102 and the doped substrate 104. The pn-junction formed by the conventional doped well 102 and the doped substrate 104 is reverse biased when a reverse bias voltage is applied to the doped semiconductor device 100.

As shown in FIG. 1B, a depletion region 106 is formed between the conventional doped well 102 and the doped substrate 104 when a reverse bias voltage is applied to the conventional doped well 102 and the doped substrate 104. The depletion region 106 is a space charge region depleted of mobile carriers. The relatively high concentrations of dopants in the conventional doped well 102 and the doped substrate 104 causes the width of the depletion region 106 to be relatively narrow for a range of reverse bias voltages. The relatively narrow width of the depletion region 106 causes the doped semiconductor device 100 to have a low breakdown voltage.

Figure 2A:
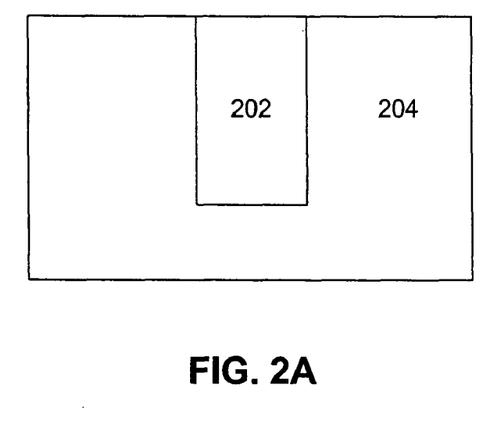
FIG. 2A illustrates a doped semiconductor device with a conventional low doped well having a high breakdown voltage.
Figure 2B:
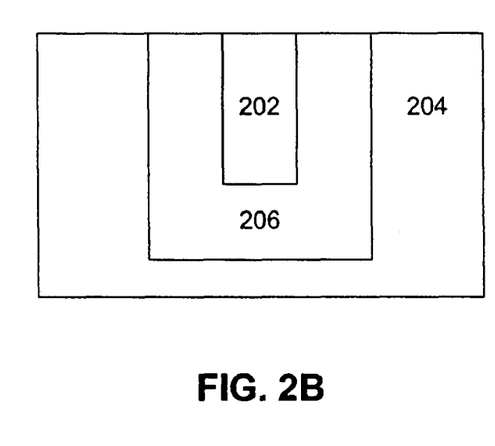
FIG. 2B illustrates the behavior of the doped semiconductor device depicted in FIG. 2A when a reverse bias voltage is applied to the doped semiconductor device.

FIG. 2A and FIG. 2B illustrate a doped semiconductor device 200 having a high breakdown voltage. As shown in FIG. 2A, the doped semiconductor device 200 includes a conventional low doped well 202 and a low doped substrate 204. The conventional low doped well 202 has a relatively low concentration of dopant and has a deep junction depth, relative to the depth of the low doped substrate 204. A conventional low doped well has a concentration level on the order of $10^{16}/cm^3$. The deep junction depth of the low doped well provides a large surface area for current flow. The low doped substrate 204 also has a relatively low concentration of dopant. The polarity of the dopant added to the low doped substrate 204, however, is opposite the polarity of the dopant added to the conventional low doped well 202. A pn-junction is therefore formed by the intimate contact of the conventional low doped well 202 with the low doped substrate 204.

FIG. 2A shows the doped semiconductor device 200 without a bias voltage applied to the conventional low doped well 202 and the low doped substrate 204. FIG. 2B illustrates the behavior of the doped semiconductor device 200 when a reverse bias voltage is applied to the conventional low doped well 202 and the low doped substrate 204. As shown in FIG. 2B, a depletion region 206 is formed between the conventional low doped well 202 and the low doped substrate 204. The relatively low concentrations of dopants in the conventional low doped well 202 and the low doped substrate 204 causes the width of the depletion region 206 to be wider than the width of the depletion region 106 depicted in FIG. 1B for a given reverse bias voltage. The relatively wide width of the depletion region 206 causes the doped semiconductor device 100 to have a high breakdown voltage. Specifically, the breakdown voltage of the doped semiconductor device 200 will be larger than the breakdown voltage of the doped semiconductor device 100.

The circuit devices within a high voltage integrated circuit are required to have high voltage tolerances. The breakdown voltages of the circuit devices within a high voltage integrated circuit must be higher than the operating voltage of any internal circuit within the high voltage integrated circuit. The doped semiconductor device 200 is often used to build a high voltage device for use within a high voltage integrated circuit. The low doping profile of the conventional low doped well 202 increases the breakdown voltage of the doped semiconductor device 200, thereby ensuring the doped semiconductor device 200 has a high voltage tolerance.

A high voltage integrated circuit also requires suitable Electrostatic Discharge (ESD) protection. An ESD protection device within a high voltage integrated circuit must provide an ESD trigger voltage that is above the operating voltage of any internal circuit, yet below the breakdown voltage of any circuit device. The operating voltages of the internal circuits are often pushed up near the breakdown voltages of the constituent circuit devices. The ESD trigger voltage of an ESD protection device must therefore be set within the narrow range established by the maximum operating voltage and the minimum breakdown voltage. The doped semiconductor device 200 is often not suitable for application as an ESD protection device because it is principally designed to be a high voltage device. There is therefore a need to design a high voltage device incorporating the use of low doped wells that is suitable for providing ESD protection within a high voltage integrated circuit.

Figure 3:
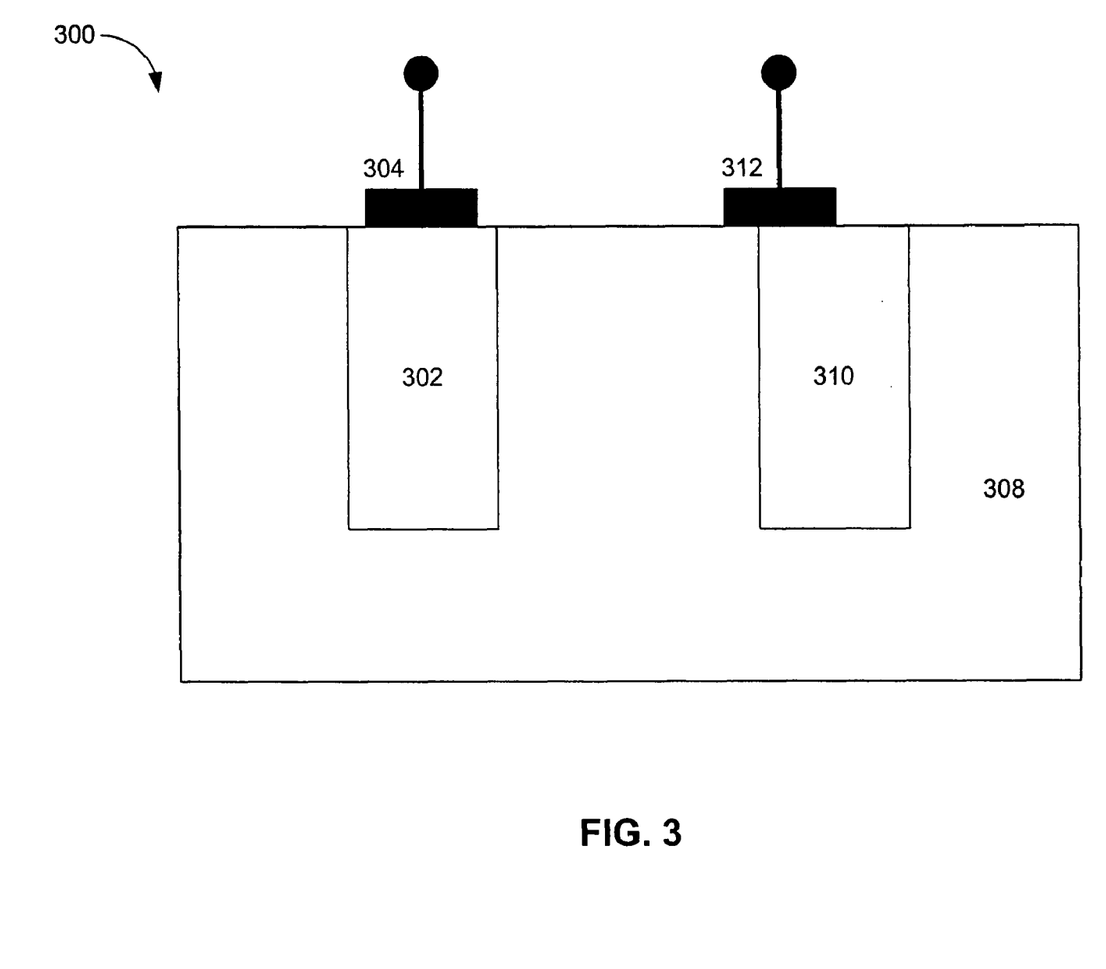
FIG. 3 illustrates an ESD protection device of the invention that provides ESD protection for high voltage applications.

FIG. 3 illustrates an ESD protection device 300 that provides ESD protection for high voltage applications, in accordance with the present invention. The ESD protection device 300 can be used in a high voltage integrated circuit. The ESD protection device provides an ESD trigger voltage that is above the operating voltage of any internal circuit and below the breakdown voltage of any circuit device within a high voltage integrated circuit.

As shown in FIG. 3, the ESD protection device 300 includes a low doped well 302. The low doped well 302 has a relatively low concentration of dopant. That is, the low doped 302 well has a concentration level on the order of concentration level on the order of $10^{16}/cm^3$. In one aspect of the present invention, the low doped well 302 has a peak dopant concentration level of $8\times10^{16}/cm^3$. The low doped well 302 is connected to a contact 304. The contact 304 is a conductor and is used to apply a bias voltage to the low doped well 302.

As further shown in FIG. 3, the ESD protection device 300 includes a diffusion area 310. The diffusion area 310 either wholly or partially contains dopant of the same polarity as the dopant within the low doped well 302. The diffusion area 310 has a concentration level that is greater than the concentration level of the low doped well 302. The diffusion area 310 is connected to a contact 312. The ESD protection device 300 also includes a substrate 308. The substrate 308 has a relatively low concentration of dopant. The polarity of the dopant within the substrate 308 is opposite the polarity of the dopant within the low doped well 302 and the diffusion area 310. The substrate 308 is also connected to the contact 312 since the contact 312 straddles the boundary formed by the substrate 308 and the diffusion area 310. The contact 312 is a conductor and is used to apply a bias voltage to the diffusion area 310 and to the substrate 308.

The low doped well 302 has a deep junction depth, relative to the depth of the substrate 308. The contact 304 and the contact 312 are typically made of metal. The contact 304 and the low doped well 302 together form the high voltage terminal of the ESD protection device 300. The contact 312 and the diffusion area 310 together form the punch-through terminal of the ESD protection device 300.

Figure 4:
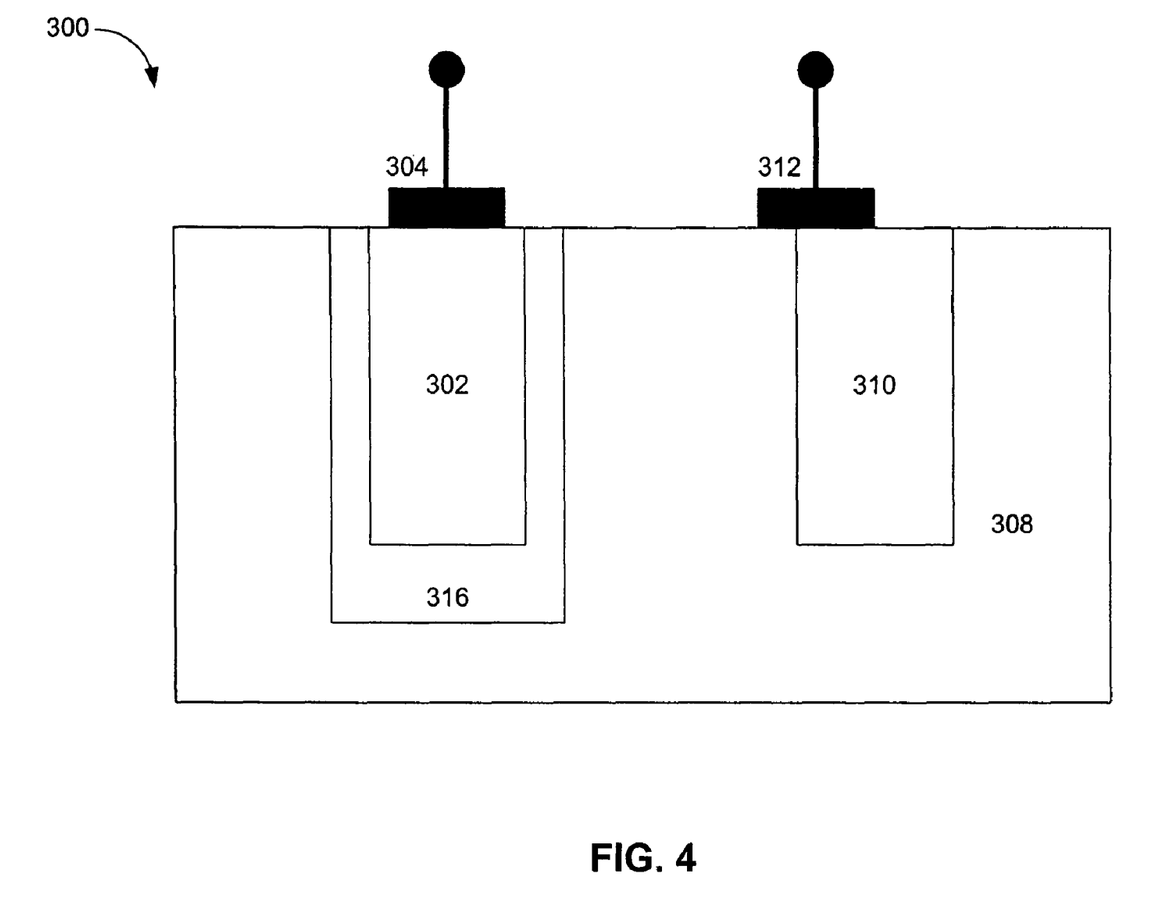
FIG. 4 illustrates the behavior of the ESD protection device depicted in FIG. 3 when a reverse bias voltage is applied to the ESD protection device.

FIG. 4 illustrates the behavior of the ESD protection device 300 during normal operation within a high voltage integrated circuit. A highly reversed biased voltage is applied to the ESD protection device 300 during normal operation. A reverse bias voltage is applied to the ESD protection device 300 when the polarities of the voltages applied to the high voltage terminal and the punch-through terminal are opposite the polarities of the dopants within the low doped well 302 and the substrate 308, respectively. The pn-junction formed by the intimate contact of the low doped well 302 and the substrate 308 is reversed biased when a reverse bias voltage is applied to the ESD protection device 300.

As shown in FIG. 4, a depletion region 316 is formed between the low doped well 302 and the substrate 308 when a reverse bias voltage is applied to the low doped well 302 and the substrate 308. The width and size of the depletion region 316 increases as the reverse bias voltage applied to the ESD protection device 300 is increased. The width of the depletion region 316 therefore fluctuates in size as the operating voltage of the high voltage integrated circuit varies. The low doped well 302 ensures that the width of the depletion region 316 can be large, thereby providing a high breakdown voltage for the ESD protection circuit 300 that can accommodate high operating voltages.

The contact 312 applies the same voltage potential to the substrate 308 and to the diffusion area 310 during normal operation. The pn-junction formed by the intimate contact of the substrate 308 and the diffusion area 310 is therefore not reverse biased during normal operation. Consequently, a depletion region is not formed between the substrate 308 and the diffusion area 310 when a reverse bias voltage is applied to the ESD protection device 300.

Figure 5:
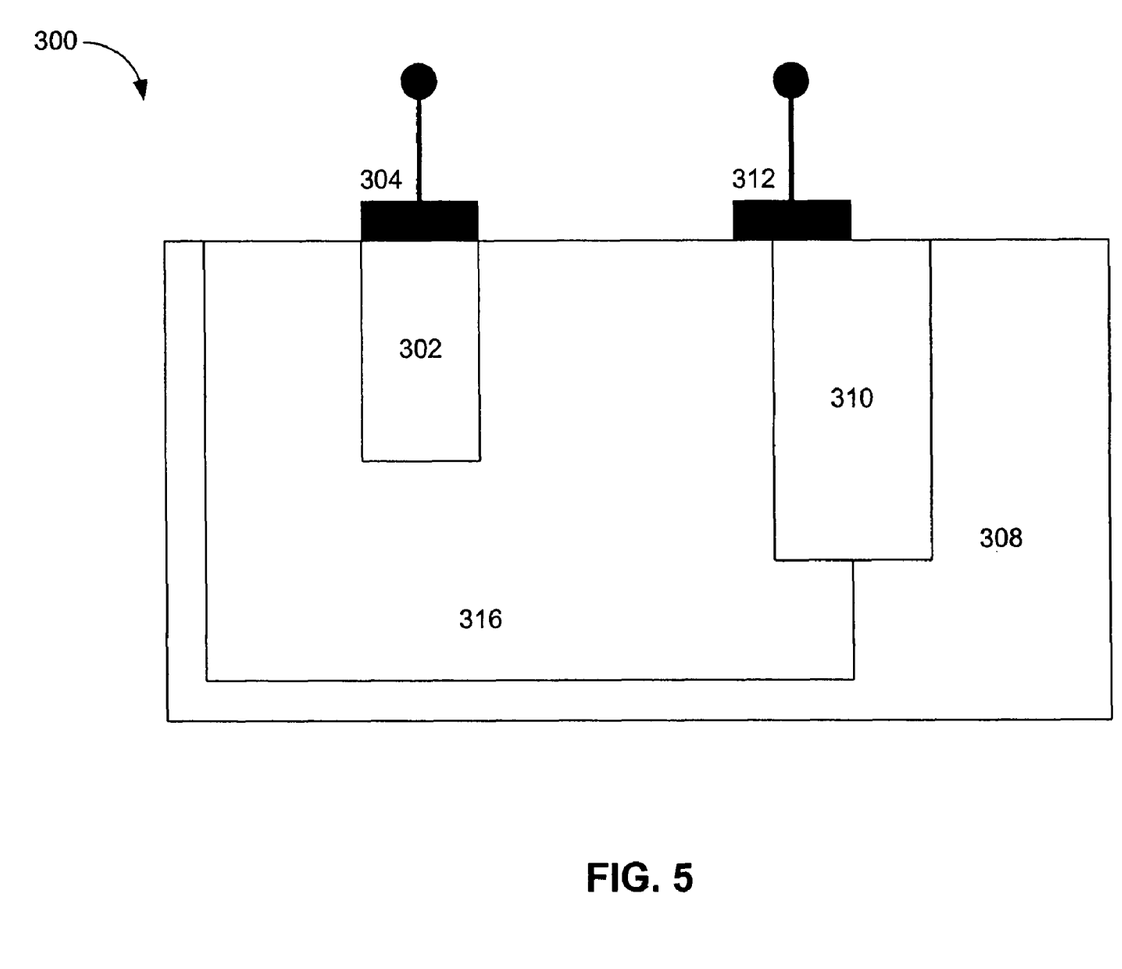
FIG. 5 illustrates the behavior of the ESD protection device depicted in FIG. 3 during an ESD event.

FIG. 5 illustrates the behavior of the ESD protection device 300 during an ESD event within a high voltage integrated circuit. An ESD event occurs within a high voltage integrated circuit when a voltage applied or a current supplied to any internal circuit exceeds a predetermined safe level. The ESD protection device 300 provides protection during an ESD event by providing an ESD discharge path between the high voltage terminal and the punch-through terminal of the ESD protection device 300. A current discharge path is created when the reverse bias voltage applied to the ESD protection device 300 causes the depletion region 306 to reach or "punch through" to the diffusion area 310. The magnitude of the reverse bias voltage that causes the depletion region to reach the diffusion area 310 is the ESD trigger voltage of the ESD protection device 300. The depletion region therefore effectively punches through from the high voltage terminal to the punch-through terminal of the ESD protection device 300 at the ESD trigger voltage.

The triggering voltage of the ESD protection device 300 is determined by the distance separating the low doped well 302 from the diffusion area 310. The distance between the low doped well 302 and the diffusion area 310 prevents the contact 304 and the contact 312 from shorting out during normal operation. That is, the distance between the low doped well and the diffusion area 310 is large enough to prevent the depletion region 316 from reaching the diffusion area 310 under normal operating voltages.

The distance between the low doped well 302 and the diffusion area 310 also prevents the ESD protection device 300 from having a triggering voltage that is too high. That is, the distance between the low doped well 302 and the diffusion area 310 is small enough to enable the depletion region 316 to reach the diffusion area 310 without requiring a reverse bias voltage that exceeds a breakdown voltage of a circuit device within the high voltage integrated circuit.

Overall, the distance between the low doped well 302 and the diffusion area 310 provides an ESD triggering voltage that is above the normal operating voltages of the high voltage integrated circuit and below the breakdown voltage of the circuit devices within the high voltage integrated circuit.

The low doped well 302 has a high voltage tolerance required by high voltage integrated circuits that cannot be provided by a conventionally doped well. Additionally, the low doped well 302 provides a reduced diffusion capacitance in comparison to a conventionally doped well. A reduced diffusion capacitance is desirable in high frequency applications and low signal distortion applications.

The ESD protection device 300 can be formed by conventional semiconductor manufacturing processes. The substrate 308 forms a bottom layer of the ESD protection device 300. A middle layer of the ESD protection 300 device includes the low doped well 302, the substrate 308 and the diffusion area 310. The low doped well 302 is positioned within the substrate 308. The low doped well 302 has a deep junction depth relative to the depth of the substrate 308. Impurities added to the substrate 308 have a polarity opposite the polarity of the impurities added to the low doped well 302. The low doped well 302 has a low concentration of dopant, particularly at the periphery of the low doped well 302.

The diffusion area 310 is also positioned within the substrate 308. Impurities added to the diffusion area 310 have the same polarity as the polarity of the impurities added to the low doped well 302. The low doped well 302 and the diffusion area 312 are separated by the substrate 308.

A top layer of the ESD protection device 300 includes a contact 304 and a contact 312. The contact 304 is positioned over the low doped well 302. The contact 312 is positioned over the diffusion area 312 and the substrate 308. The low doped well 302 and the contact 304 form the high voltage terminal of the ESD protection device 300. The diffusion area 310 and the substrate 308 form the punch-through terminal of the ESD protection device 300.

The distance between the low doped well 302 and the diffusion area 310 determines the ESD triggering voltage of the ESD protection device. The ESD protection device 300 can be formed using either type of dopant in the low doped well 302 and the diffusion area 310 depending on the dopant type used within the substrate 308. For example, the low doped well 302 and the diffusion area 310 can be p-type materials if the substrate 308 is an n-type material. Alternatively, the low doped well 302 and the diffusion area 310 can be n-type materials if the substrate 308 is an p-type material.

To protect a circuit element or circuit within an integrated circuit, the ESD protection device 300 is configured to route a high-voltage ESD event from a signal input or voltage supply input of the circuit element or circuit to an appropriate or suitable discharge node or device. Specifically, the high voltage terminal of the ESD protection device 300 is connected to the signal input or supply input of the circuit element or circuit that could experience an ESD event. The punch-through terminal of the ESD protection device 300 is then connected to a discharge node or device to prevent exposure of the ESD event to the signal input or voltage supply input of the circuit element or circuit.

Figure 6:
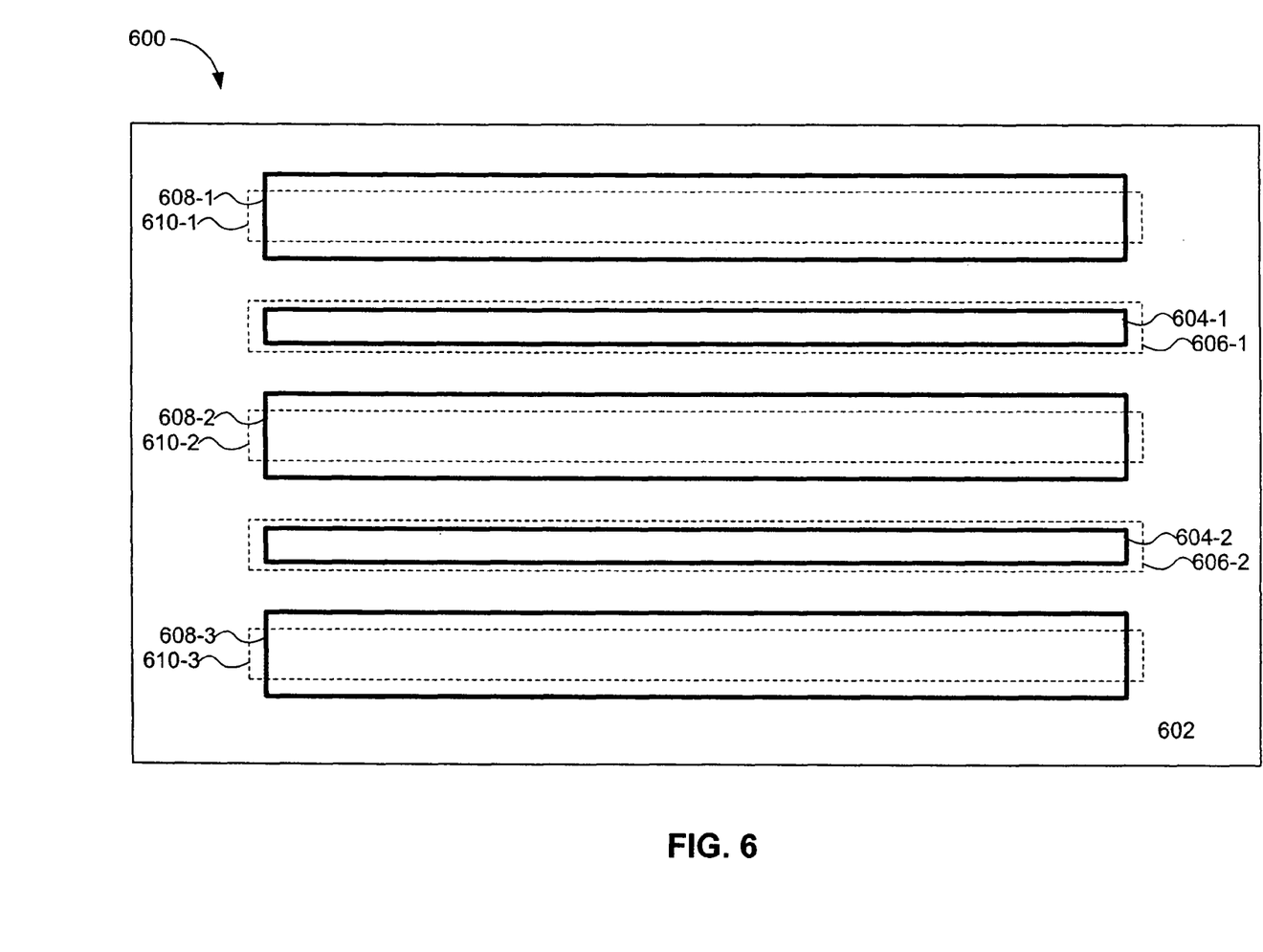
FIG. 6 illustrates an exemplary arrangement of high voltage terminals and punch-through terminals of an ESD protection device of the invention.

FIG. 6 illustrates an exemplary arrangement of high voltage terminals and punch-through terminals of an ESD protection device 600 providing ESD protection in accordance with the present invention. FIG. 6 provides an overhead view of a layout of the multiple high voltage and punch-through terminals of the ESD protection device 600.

As shown in FIG. 6, contacts 604-1 and 604-2 are connected to low doped wells 606-1 and 606-2, respectively. The low doped wells 606-1 and 606-2 are positioned within a substrate 602. The contacts 604-1 and 604-2 are positioned within the horizontal boundaries of the low doped wells 606-1 and 606-2, respectively. Contacts 608-1, 608-2 and 608-3 are connected to diffusion areas 610-1, 610-2 and 610-3, respectively. Contacts 608-1, 608-2 and 608-3 are also connected to the substrate 602. The diffusion areas 610-1, 610-2 and 610-3 are positioned within the substrate 602. The contacts 608-1, 608-2 and 608-3 extend beyond the horizontal boundaries of the diffusion areas 610-1, 610-2 and 610-3, respectively. Low doped wells 606-1 and 606-2 have a concentration level that is similar to the concentration level of the low doped well 302 depicted in FIG. 3. The diffusion areas 610-1, 610-1 and 610-3 have a concentration level on the order of the diffusion area 310 depicted in FIG. 3.

The contact 604-1 and the low doped well 606-1 form a high voltage terminal. The contact 604-2 and the low doped well 606-2 also form a high voltage terminal. The contacts 608-1, 608-2 and 608-3, in conjunction with their respective diffusion areas 610-1, 610-2 and 610-3, each form a punch-through terminal. ESD current discharge paths are created between the high voltage terminals and the punch-through terminals of the ESD protection device 600 during an ESD event.

ESD protection efficiency is improved by forming the high voltage terminals and punch-through terminals depicted in FIG. 6 into long, thin strips. The arrangement of the high voltage terminals and punch-through terminals maximizes current flow between the high voltage and punch-through terminals for a desired distance during an ESD event. Specifically, the surface areas of the low doped wells 606-1 and 606-2 and the surface areas of the diffusion areas 610-1, 610-2 and 610-3 are maximized for a specific ESD triggering voltage. Large current discharge paths are created along the sidewalls of the low doped wells 606-1 and 606-2 and the diffusion areas 610-1, 610-2 and 610-3 when an applied reverse bias voltage triggers an ESD event.

The ends of the low doped wells 606-1 and 606-2 extend beyond the vertical boundaries of the contacts 604-1 and 604-2, respectively. The ends of the diffusion areas 610-1, 610-2 and 610-3 also extend beyond the vertical boundaries of the contacts 608-1, 608-2 and 608-3, respectively. This layout minimizes conduction at the ends of the low doped wells 606-1 and 606-2 and the diffusion areas 610-1, 610-2 and 610-3. In turn, the current discharge paths formed between the high voltage terminals and punch-through terminals of the ESD protection device 600 are less affected by edge effects that can result in non-uniform current flow.

Figure 7:
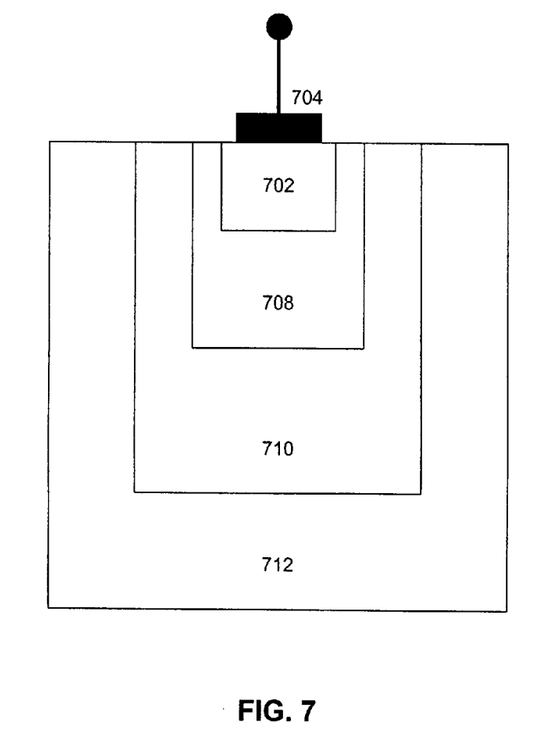
FIG. 7 illustrates an exemplary doping profile of a low doped well for a high voltage terminal of an ESD protection device of the invention.

FIG. 7 illustrates an exemplary doping profile of a low doped well for a high voltage terminal of an ESD device that provides ESD protection in accordance with the present invention. The low doped well depicted in FIG. 7 is divided into three doped regions. A doped region 702 is located in the center of the low doped well and is connected to a contact 704. The doped region 702 has a relatively high dopant concentration. A doped region 708 envelops the doped region 702. The doped region 708 has a dopant concentration that is lower than the dopant concentration of the doped region 702. A doped region 710 envelops the doped region 708 and forms a boundary with a substrate 712. The doped region 710 has a dopant concentration that is lower than the dopant concentration of the doped region 708.

The successively decreasing concentrations of dopant within the doped regions 702, 708 and 710 form a doping gradient. The high concentration of dopant within dopant region 702 provides a low resistive contact between the low doped well and the contact 704.

The periphery of the low doped well (i.e., the doped region 710) has a low doping concentration regardless of the doping concentration of the interior of the low doped well (i.e., the doped regions 702 and 708). Doping profiles other than the exemplary profile shown in FIG. 7 are possible provided the periphery of the low doped well maintains a low doping concentration. The low concentration of dopant in the periphery of the low doped well used to form the high voltage terminal ensures that the pn-junction of the low doped well boundary (i.e., the boundary between doped region 710 and the substrate 712) is suitable for high voltage applications.

In one aspect of the present invention, the doped region 702 is a conventional doped diffusion area having a concentration level that is greater than $7 \times 10^{17}/cm^3$, the doped region 708 is a conventional doped well having a concentration level on the order of $10^{17}/cm^3$ and the doped region 710 is a low doped well having a concentration level on the order of $10^{16}/cm^3$. In another aspect of the present invention, the concentration level of the doped region 702 is less than or equal to $1 \times 10^{20}/cm^3$, the concentration level of the doped region 708 is between $5 \times 10^{17}/cm^3$ and $7 \times 10^{17}/cm^3$ and the concentration level of the doped region 710 is less than or equal to $8 \times 10^{16}/cm^3$.

Figure 8A:
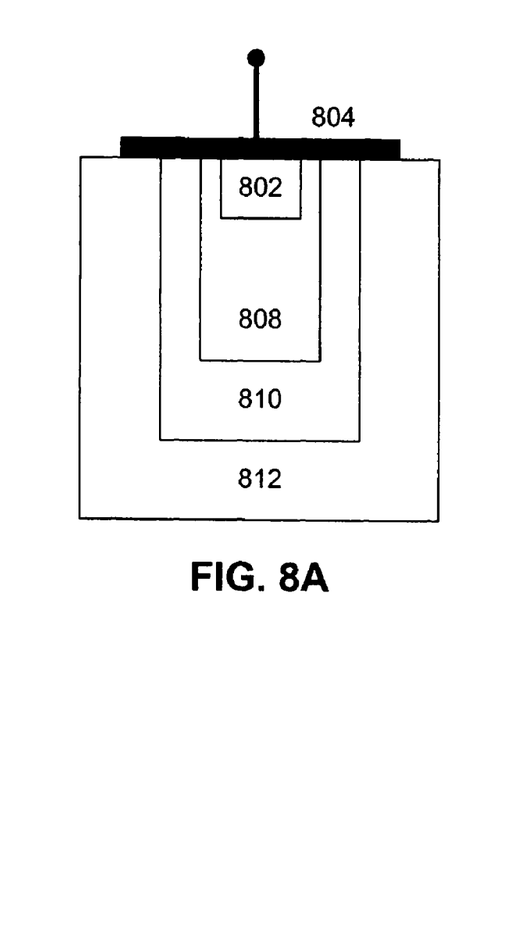
FIGS. 8A, 8B and 8C illustrate exemplary doping profiles of diffusion areas for a punch-through terminal of an ESD device of the invention.
Figure 8B:
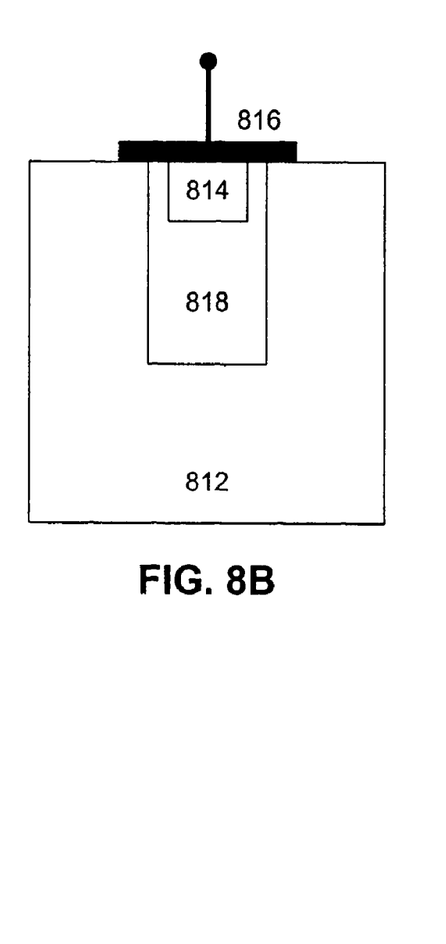
Figure 8C:
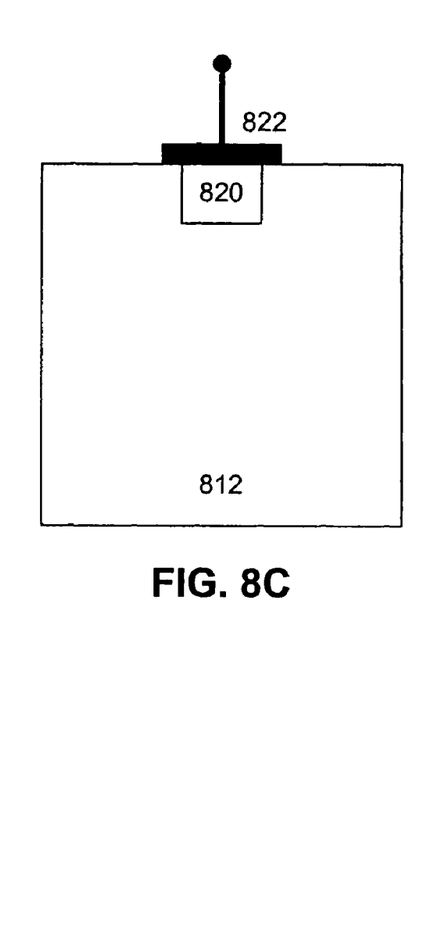

FIGS. 8A, 8B and 8C illustrate exemplary doping profiles of diffusion areas for a punch-through terminal of an ESD device that provides ESD protection in accordance with the present invention. An ESD device that provides ESD protection in accordance with the present invention does not require the diffusion area of the second terminal to be a low doped well. Further, an ESD device that provides ESD protection in accordance with the present invention does not require the diffusion area to have a deep junction depth. The doping profile and junction depth of the diffusion area of the punch-through terminal can therefore exhibit a wide range of variation to provide ESD protection in accordance with the present invention.

FIG. 8A illustrates a punch-through terminal that has a diffusion area that is divided into three doped regions. A doped region 802 is located in the center of the diffusion area and is connected to a contact 804. The doped region 802 has a relatively high dopant concentration. A doped region 808 envelops the doped region 802. The doped region 808 has a dopant concentration that is lower than the dopant concentration of the doped region 802. A doped region 810 envelops the doped region 808 and forms a boundary with a substrate 812. The doped region 810 has a dopant concentration that is lower than the dopant concentration of the doped region 808. The successively decreasing doping concentrations of the doped regions 802, 808 and 810 form a doping gradient. The contact 804 extends beyond the boundary of the diffusion area and is also connected to the substrate 812. The high concentration of dopant within doped region 802 provides a low resistive contact between the diffusion area and the contact 804. The concentration levels of the doped regions 802, 808 and 808 can correspond to the concentration levels (and types) of the doped regions 702, 708 and 710 depicted in FIG. 7, respectively.

FIG. 8B illustrates a punch-through terminal having a diffusion area that includes a conventional doped well. The diffusion area depicted in FIG. 8B has two doped regions. A doped region 814 is located in the center of the diffusion area and is connected to a contact 816. The doped region 814 has a relatively high dopant concentration. A doped region 818 envelops the doped region 814 and forms a boundary with the substrate 812. The contact 816 extends beyond the boundary of the diffusion area and is also connected to the substrate 812. The high concentration of dopant within doped region 814 provides a low resistive contact between the diffusion area and the contact 816. The doped region 814 can be a conventional doped diffusion area and the doped region 818 can be a conventional doped well.

FIG. 8C illustrates a punch-through terminal having a diffusion area that is a conventional doped diffusion area. The diffusion area depicted in FIG. 8B includes a doped region 820. The doped region 820 is located in the center of the diffusion area and is connected to a contact 822. The contact 822 extends beyond the boundary of the diffusion area and is also connected to the substrate 812.

FIGS. 8A, 8B and 8C show that the diffusion areas for a punch-through terminal of an ESD device that provides ESD protection in accordance with the present invention can be a low doped well (i.e., FIG. 8A), a conventional doped well (FIG. 8B) or a conventional doped diffusion area (i.e., FIG. 8C).

Figure 9A:
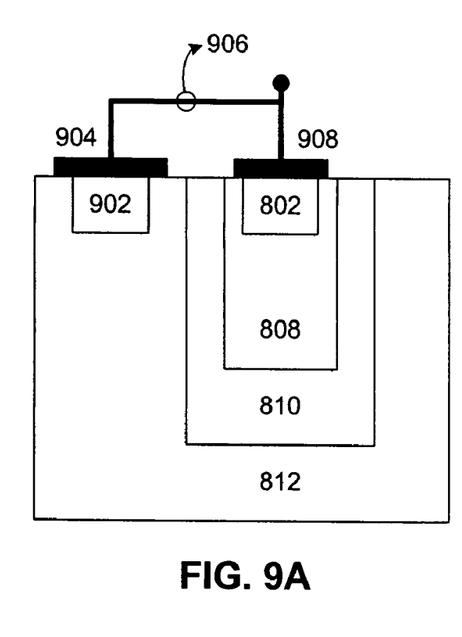
FIGS. 9A, 9B and 9C illustrate possible variations of the punch-through terminals depicted in FIGS. 8A, 8B and 8C, respectively.
Figure 9B:
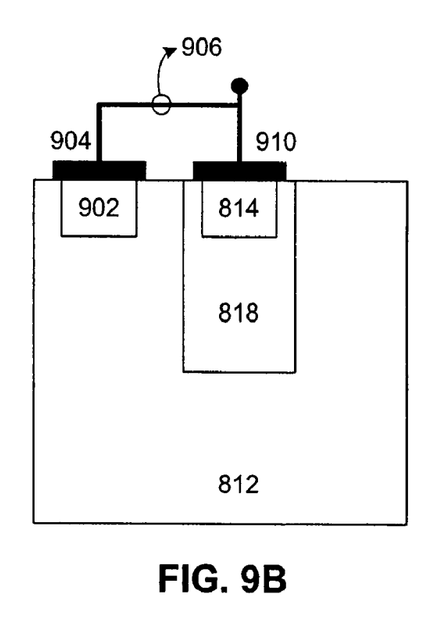
Figure 9C:
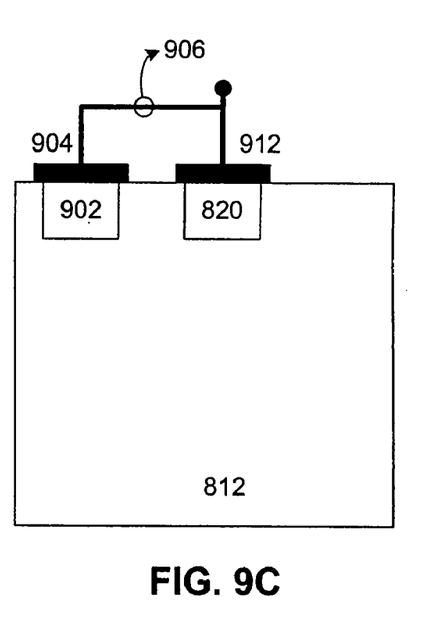

FIGS. 9A, 9B and 9C illustrate possible variations of the punch-through terminals depicted in FIGS. 8A, 8B and 8C, respectively. The punch-through terminals depicted in FIGS. 9A, 9B and 9C each include a substrate biasing contact 904. The substrate biasing contact 904 is connected to a diffusion area 902. The diffusion area 902 is positioned within the substrate 812. The polarity of the dopant within the diffusion area 902 is the same as the polarity of the dopant within the substrate 812. The diffusion area 902 has a high concentration of dopant, relative to the substrate 812. This high concentration of dopant in the diffusion area 902 provides a low resistive conduction path between the substrate biasing contact 904 and the substrate 812 for improved biasing of the substrate 812.

As shown in FIG. 9A, the substrate biasing contact 904 is connected to a contact 908 by a conductor 906. The conductor 906 provides a bias voltage to the substrate biasing contact 904. The contact 908 is located over the diffusion area formed by the doped regions 802, 808 and 810. The contact 908 is used to bias the diffusion area formed by the doped regions 802, 808 and 810 while the substrate biasing contact 904 is used to bias the diffusion area 902. It is unnecessary to connect the contact 908 to the substrate 812 since the substrate biasing contact 904 is used to bias the substrate 812.

As shown in FIG. 9B, a contact 910 is located over the diffusion area formed by the doped regions 814 and 818. Similarly, a contact 912 shown in FIG. 9C is located over the diffusion area 820. It is unnecessary to connect the contacts 910 and 912 to the substrate 812 since the substrate biasing contact 904 is used to bias the substrate 812. The biasing of the substrate 812 is improved by the addition of the diffusion area 902 and the substrate biasing contact 904 for the punch-through terminals depicted in FIGS. 9B and 9C.

Figure 10:
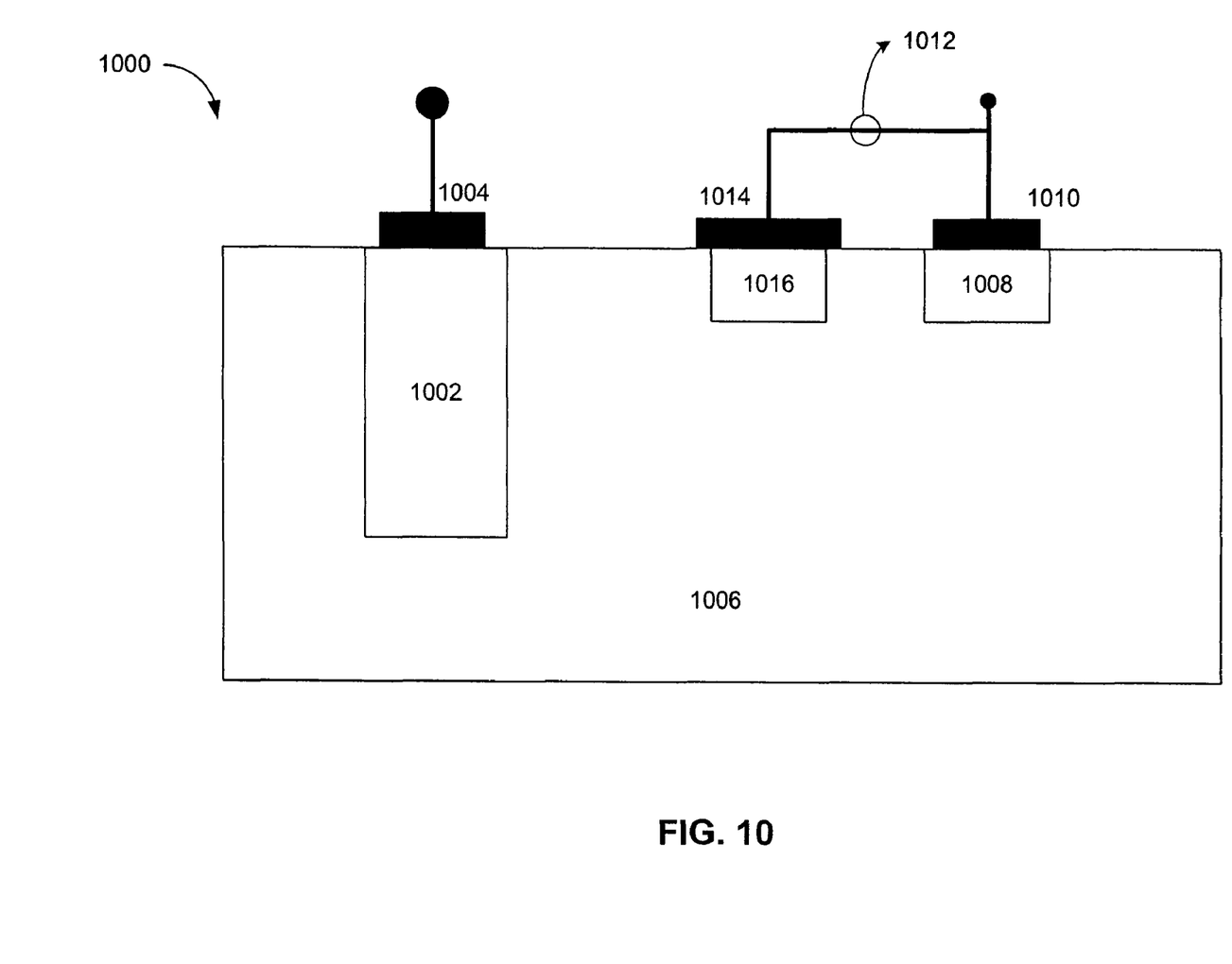
FIG. 10 illustrates an ESD protection device incorporating the additional substrate biasing contact depicted in FIGS. 9A, 9B and 9C.

FIG. 10 illustrates an ESD protection device 1000 incorporating the additional substrate biasing contact depicted in FIGS. 9A, 9B and 9C. The ESD protection device 1000 provides ESD protection for high voltage applications, in accordance with the present invention. The ESD protection device 1000 includes a low doped well 1002. The low doped well 1002 is positioned within a substrate 1006. The low doped well 1002 is connected to a contact 1004. The low doped well 1002 and the contact 1004 together form the high voltage terminal of the ESD protection device 1000.

As further shown in FIG. 10, the ESD protection device 1000 includes a diffusion area 1008. The polarity of the dopant within the diffusion area 1008 is the same as the polarity of the dopant within the low doped well 1002. The diffusion area 1008 is positioned within the substrate 1006 and is connected to a contact 1010. The contact 1010 is connected by a conductor 1012 to a contact 1014. The contact 1014 is connected to a diffusion area 1016. The polarity of the dopant within the diffusion area 1016 is the same as the polarity of the dopant within the substrate 1006. The diffusion area 1016, however, has a higher concentration of dopant than the substrate 1016.

The diffusion area 1008 and the contact 1010 together form the punch-through terminal of the ESD protection device 1000. The high concentration of dopant within the diffusion area 1016 provides a low resistive connection to the substrate 1006. The diffusion area 1016 therefore provides an improved conduction path from the punch-through terminal of the ESD protection device 1000 into the substrate 1006 for biasing.

The ESD protection device 1000 is reverse biased during normal operation. The ESD protection device 1000 will provide a discharge path between the contact 1004 and the contact 1010 when the reverse bias voltage exceeds an ESD triggering voltage of the ESD protection device 1000. This behavior of the ESD protection device 1000 provides reverse bias ESD discharge protection.

The ESD protection device 1000 also provides forward bias discharge protection. A forward biased pn-junction diode is formed between the low doped well 1002 and the substrate 1006 when the voltage applied to the high-voltage terminal and punch-through terminal is forward biased. The forward biasing of the pn-junction formed by the low doped well 1002 and the substrate 1006 is improved by the high concentration of dopant in the diffusion area 1016. A discharge path is formed between the contact 1004 and the contact 1014 when the ESD protection device 1000 is forward biased. In this way, the ESD protection device 1000 provides improved forward biased ESD discharge protection.

CONCLUSION

While various embodiments of the present invention have been described above, it should be understood that they have been presented by way of example and not limitation. It will be apparent to one skilled in the pertinent art that various changes in form and detail can be made therein without departing from the spirit and scope of the invention. Therefore, the present invention should only be defined in accordance with the following claims and their equivalents.

What is claimed is:

1. An electrostatic discharge (ESD) device, comprising:
a substrate;
a high voltage terminal having a low-doped well formed in the substrate, and a first contact, coupled to the low doped well, that has a perimeter located within a perimeter of the low-doped well;
a punch-through terminal having a diffusion area formed in the substrate, and a second contact, coupled to the diffusion area, that touches the substrate,
wherein a concentration level of a dopant in the low-doped well has a peak level of $8 \times 10^{16}/cm^3$ and is less than a concentration level of the dopant in the diffusion area,
wherein the substrate and the low-doped well are configured to form a depletion region between the low-doped well and the substrate when a reverse bias voltage is applied to the low-doped well and the substrate, and
wherein the substrate, the low-doped well, and the diffusion area are configured to form a current discharging path between the first contact and the second contact when the depletion region comes into contact with the diffusion area.

2. The ESD device of claim 1, wherein the second contact is positioned to prevent a reverse bias between the substrate and the diffusion area.

3. The ESD device of claim 1, wherein a distance between the low-doped well and the diffusion area determines a triggering voltage of the ESD device.

4. The ESD device of claim 1, wherein a periphery of the diffusion area has a lower concentration of a dopant relative to a center of the diffusion area.

5. The ESD device of claim 1, wherein the substrate and the low-doped well are further configured to increase a width of the depletion region as the reverse bias voltage increases.

6. The ESD device of claim 1, wherein the substrate, the low-doped well, and the diffusion area are further configured such that a triggering voltage of the ESD device is equal to the reverse bias voltage that causes the depletion region to come into contact with the diffusion area.

7. The ESD device of claim 1, wherein a periphery of the low-doped well has a lower concentration of a dopant relative to a center of the low-doped well.

8. The ESD device of claim 1, wherein the dopant polarity of the low-doped well is n-type.

9. The ESD device of claim 1, wherein the dopant polarity of the low-doped well is p-type.

10. The ESD device of claim 1, further comprising:
a second high voltage terminal having a second low-doped well formed in the substrate,
wherein the second low-doped well is coupled to a third contact and a perimeter of the third contact is located completely within a perimeter of the second low-doped well,
wherein the punch-through terminal is located between the first and second high voltage terminals.

11. The ESD device of claim 1, further comprising:
a second punch-through terminal having a second diffusion area formed in the substrate,
wherein the second diffusion area is coupled to a third contact that touches the substrate,
wherein a perimeter of the second diffusion area overlaps a perimeter of the third contact; and
wherein the high voltage terminal is located between the first and second punch-through terminals.

12. The ESD device of claim 11, wherein the second contact is coupled to the third contact.

13. A method for forming an electrostatic discharge (ESD) device, comprising:
forming a substrate;
forming a high voltage terminal having a low-doped well formed in the substrate,
wherein the low-doped well is coupled to a first contact and a perimeter of the first contact is located within a perimeter of the low-doped well; and
forming a punch-through terminal having a diffusion area formed in the substrate,
wherein the diffusion area is coupled to a second contact that touches the substrate,
wherein a concentration level of a dopant in the low-doped well has a peak level of $8 \times 10^{16}/cm^3$ and is less than a concentration level of the dopant in the diffusion area,
wherein the substrate and the low-doped well are configured to form a depletion region between the low-doped well and the substrate when a reverse bias voltage is applied to the low-doped well and the substrate, and wherein the substrate, the low-doped well, and the diffusion area are configured to form a current discharging path between the first contact and the second contact when the depletion region comes into contact with the diffusion area.

14. The method of claim 13, wherein the forming a punch-through terminal further comprises positioning the second contact to prevent a reverse bias between the substrate and the diffusion area.

15. The method of claim 13, wherein the forming a punch-through terminal further comprises doping a periphery of the diffusion area with a lower concentration of a dopant relative to a center of the diffusion area.

16. The method of claim 13, further comprising forming a second high voltage terminal having a second low-doped well formed in the substrate,
wherein the second low-doped well is coupled to a third contact and a perimeter of the third contact is located completely within a perimeter of the second low-doped well,
wherein the punch-through terminal is located between the first and second high voltage terminals.

17. The method of claim 12, further comprising forming a second punch-through terminal having a second diffusion area formed in the substrate,
wherein the second diffusion area is coupled to a third contact that touches the substrate,
wherein a perimeter of the second diffusion area overlaps a perimeter of the third contact; and
wherein the high voltage terminal is located between the first and second punch-through terminals.

18. The method of claim 16, further comprising coupling the second contact to the third contact.

19. The method of claim 12, wherein a perimeter of the second contact extends beyond a corresponding perimeter of the diffusion area.

20. The method of claim 13, wherein the low doped well has a deep junction depth relative to the substrate.

21. The ESD device of claim 1, wherein a perimeter of the second contact extends beyond a corresponding perimeter of the diffusion area.

22. The ESD device of claim 1, wherein the low doped well has a deep junction depth relative to the substrate.

* * * * *